(12) United States Patent
Cheng et al.

(10) Patent No.: US 9,799,647 B1
(45) Date of Patent: Oct. 24, 2017

(54) INTEGRATED DEVICE WITH P-I-N DIODES AND VERTICAL FIELD EFFECT TRANSISTORS

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/243,445

(22) Filed: Aug. 22, 2016

(51) Int. Cl.
| | |
|---|---|
| *H01L 29/74* | (2006.01) |
| *H01L 29/80* | (2006.01) |
| *H01L 29/76* | (2006.01) |
| *H01L 21/00* | (2006.01) |
| *H01L 21/338* | (2006.01) |
| *H01L 21/336* | (2006.01) |
| *H01L 27/06* | (2006.01) |
| *H01L 27/02* | (2006.01) |
| *H01L 29/78* | (2006.01) |
| *H01L 29/868* | (2006.01) |
| *H01L 29/06* | (2006.01) |
| *H01L 29/66* | (2006.01) |
| *H01L 21/8234* | (2006.01) |

(52) U.S. Cl.
CPC .. *H01L 27/0629* (2013.01); *H01L 21/823418* (2013.01); *H01L 21/823437* (2013.01); *H01L 21/823475* (2013.01); *H01L 21/823481* (2013.01); *H01L 21/823487* (2013.01); *H01L 27/0255* (2013.01); *H01L 29/0649* (2013.01); *H01L 29/66666* (2013.01); *H01L 29/7827* (2013.01); *H01L 29/868* (2013.01)

(58) Field of Classification Search
CPC ..... H01L 21/823431; H01L 21/823487; H01L 21/823821; H01L 21/823885; H01L 27/0886; H01L 27/0924; H01L 27/10841; H01L 27/11582; H01L 27/11556; H01L 27/1157; H01L 29/4236; H01L 29/42372; H01L 29/7397; H01L 29/7813; H01L 29/66666; H01L 29/66909; H01L 29/7828; H01L 29/785; H01L 29/7788; H01L 29/7827; H01L 29/78642; H01L 29/7926
USPC ........ 257/220, 263, 328, 330, 331; 438/156, 438/173, 192, 212, 268
See application file for complete search history.

(56) References Cited

U.S. PATENT DOCUMENTS

| | | | |
|---|---|---|---|
| 5,828,089 A | 10/1998 | Bernier | |
| 6,031,254 A | 2/2000 | Quoirin | |
| 6,692,982 B2 * | 2/2004 | Takahashi | .......... H01L 27/0664 257/184 |
| 8,367,489 B2 | 2/2013 | Yamazaki | |

(Continued)

*Primary Examiner* — Hsien Ming Lee
(74) *Attorney, Agent, or Firm* — Cantor Colburn LLP; Vazken Alexanian

(57) ABSTRACT

An integrated device is provided. The integrated device includes a substrate having a doped upper surface section and an insulator to define first and second substrate regions on opposite sides thereof. Vertical transistors are operably arranged on the doped upper surface section at the first substrate region. P-I-N diodes are operably arranged on the doped upper surface section at the second substrate region.

16 Claims, 8 Drawing Sheets

(56) References Cited

U.S. PATENT DOCUMENTS

| | | |
|---|---|---|
| 8,698,138 B2 | 4/2014 | Yamazaki |
| 8,709,890 B2 | 4/2014 | Cheng et al. |
| 9,006,054 B2 | 4/2015 | Cheng et al. |
| 9,059,044 B2 * | 6/2015 | Cheng .................. H01L 27/1214 |
| 9,246,410 B2 | 1/2016 | Hirler et al. |
| 2013/0099234 A1 | 4/2013 | Yamazaki |
| 2014/0197407 A1 | 7/2014 | Yamazaki |
| 2016/0149021 A1 | 5/2016 | Schmenn et al. |

* cited by examiner

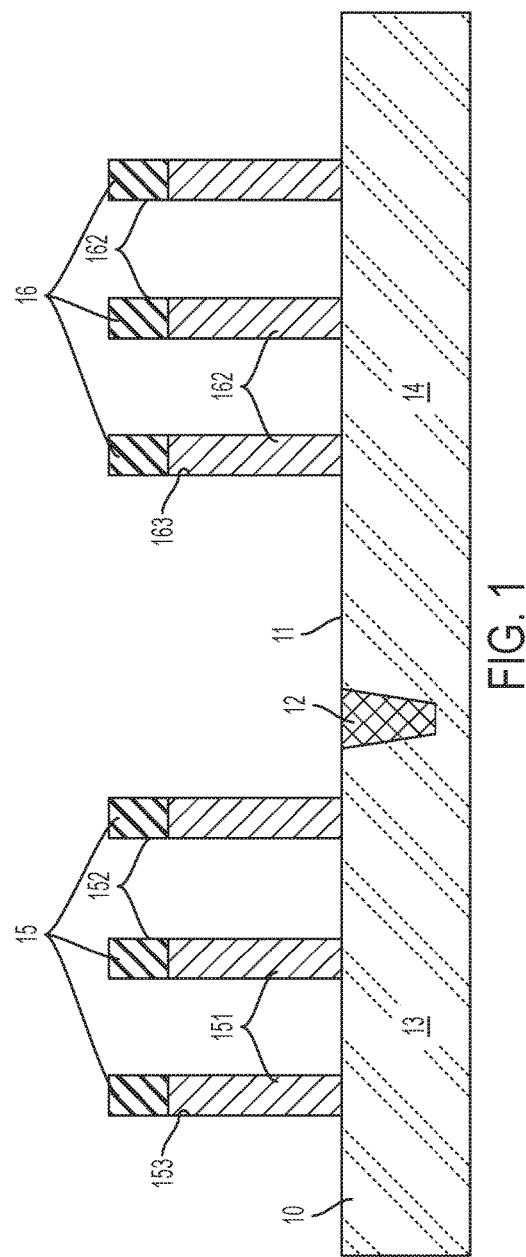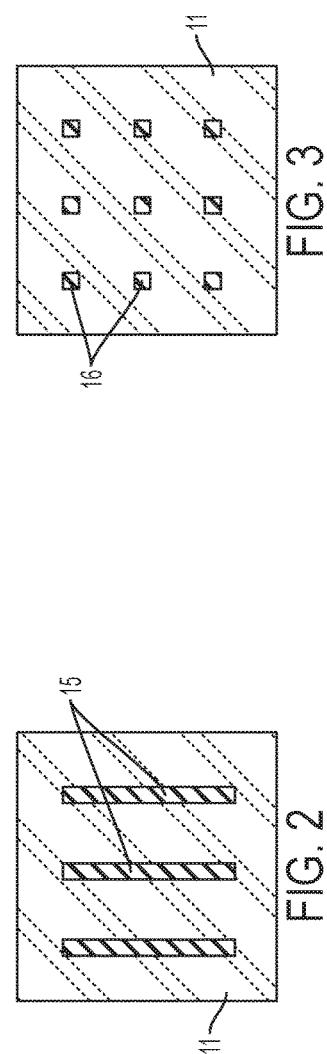

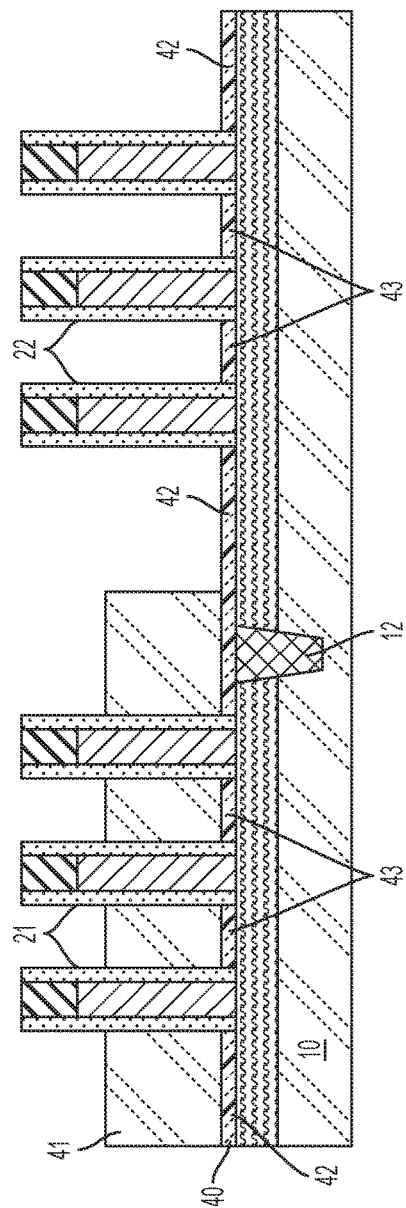
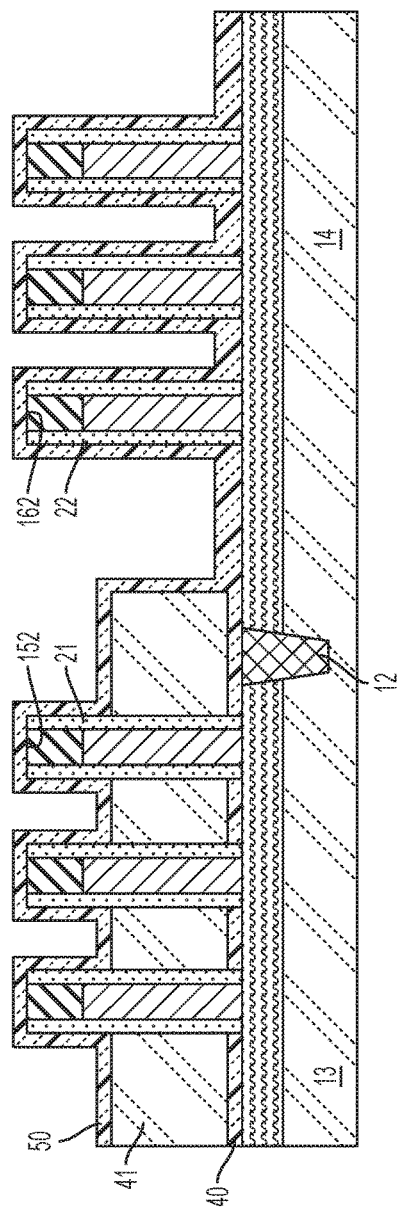

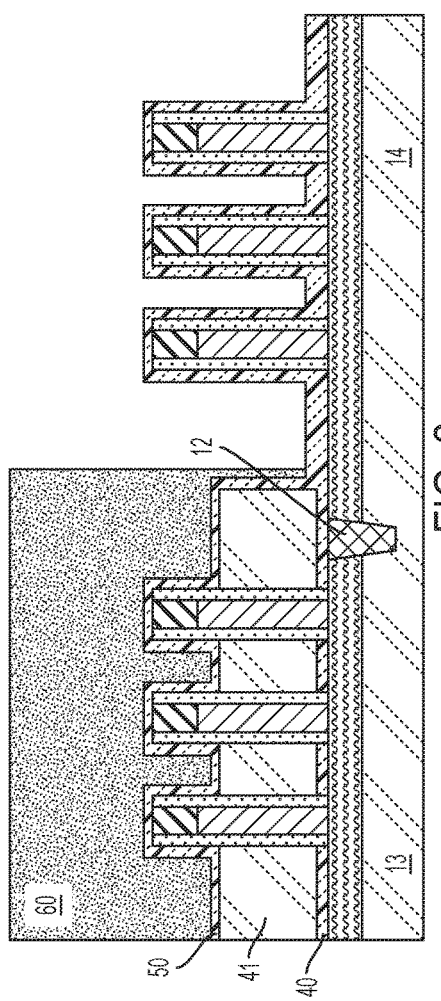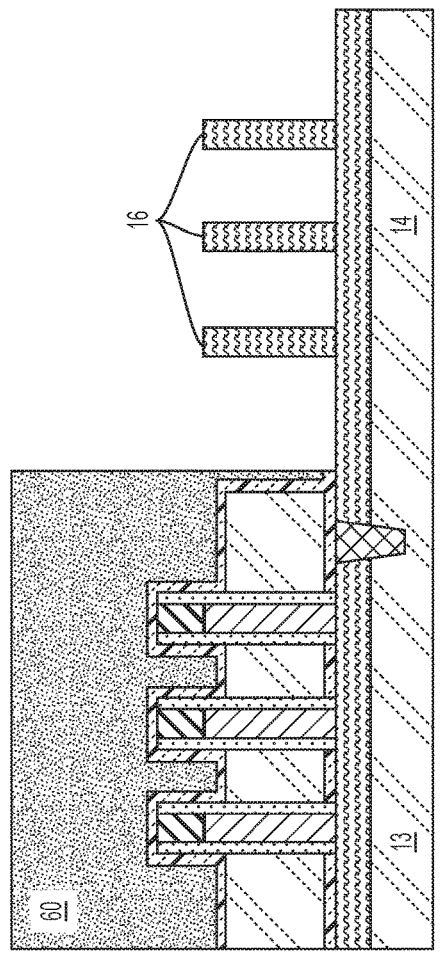

INTEGRATED DEVICE WITH P-I-N DIODES AND VERTICAL FIELD EFFECT TRANSISTORS

BACKGROUND

The present invention relates to semiconductor devices and, more specifically, to an integrated device with P-I-N diodes and vertical field effect transistors.

In semiconductor device manufacturing, vertical transistors or vertical field effect transistors (VFETs) provide advantages over other types of transistors. Such advantages include, but are not limited to, the decoupling of gate length from contact gate pitch. As a result, recent efforts have been undertaken to explore the feasibility of using VFET devices to provide continued complementary metal-oxide-semiconductor (CMOS) scaling beyond 7 nm nodes.

Junction diodes such as P-I-N diodes, for example, are commonly used in a wide variety of products such as Radio Frequency (RF) switching devices, telecommunication devices, Electrostatic Discharge (ESD) protect devices, image sensors, and the like. P-I-N diodes are diodes with wide, un-doped intrinsic semiconductor regions between p-type and n-type semiconductor regions. P-I-N diodes this have three layers. These include a P-doped semiconductor layer (P), an intrinsic layer (I) and an N-doped semiconductor layer (N). P-I-N diodes can also be used as photodetectors or optical receivers. For example, when exposed to light illumination, a current is generated in the P-I-N photodiodes and the magnitude of the current depends on the intensity of the light. When no light illumination is present, the photodiode can be reversed biased and almost no current is generated.

P-I-N junctions can also be used in various types of semiconductor devices that often require transistor elements for other applications. Where such semiconductor devices are scaled down to 7 nm node sizes or less it becomes necessary to incorporate VFETs and P-I-N diodes on the same semiconductor device substrate.

SUMMARY

According to a non-limiting embodiment of the present invention, an integrated device is provided. The integrated device includes a substrate having a doped upper surface section and an insulator. First and second substrate regions of the doped upper surface section are defined on opposite sides of the insulator. Vertical transistors are operably arranged on the doped upper surface section at the first substrate region, and P-I-N diodes are operably arranged on the doped upper surface section at the second substrate region.

According to another non-limiting embodiment, a method of forming an integrated device is provided and includes doping an upper surface section of a substrate. The method further includes forming an insulator in the substrate to define first and second substrate regions on opposite sides thereof. The method further includes operably arranging vertical transistors for disposition on the doped upper surface section at the first substrate region. The method further includes operably arranging P-I-N diodes for disposition on the doped upper surface section at the second substrate region.

According to yet another non-limiting embodiment, a method of forming an integrated device is provided and includes forming fin and pillar structures in vertical transistor and diode regions of a semiconductor substrate, respectively, which are insulated from each other. The method further includes doping an upper surface section of the semiconductor substrate. The method further includes sequentially modifying the fin structures into vertical field effect transistors (VFETs) and the pillar structures into P-I-N diodes in the vertical transistor and diode regions, respectively. The method further includes patterning contacts for electrical coupling with the doped upper surface section, at least one of the VFETs and at least one of the P-I-N diodes.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-16 are a series of views illustrating an integrated device with vertical transistors and P-I-N diodes according to exemplary embodiments of the present teachings, in which:

FIG. 1 is a side view of an integrated device with fin and pillar structures in accordance with one or more embodiments;

FIG. 2 is a top down view of the fin structures of FIG. 1;

FIG. 3 is a top down view of the pillar structures of FIG. 1;

FIG. 4 is a side view of sacrificial spacers formed along sides of fin and pillar structures in accordance with one or more embodiments;

FIG. 5 is a side view of a doped upper layer section of a semiconductor substrate with fin and pillar structures in accordance with one or more embodiments;

FIG. 6 is a side view of bottom spacers provided between fin and pillar structures and dummy gate material patterned between the fin structures in accordance with one or more embodiments;

FIG. 7 is a side view of a top spacer deposited onto dummy gate material and bottom spacer material in accordance with one or more embodiments;

FIG. 8 is a side view of a block mask deposited onto a top spacer in a vertical transistor region accordance with one or more embodiments;

FIG. 9 is a side view of pillar structures doped in a diode region with a vertical transistor region masked in accordance with one or more embodiments;

FIG. 10 is a side view of an intrinsic layer epitaxially grown over doped pillar structures in a diode region with a vertical transistor region masked in accordance with one or more embodiments;

FIG. 11 is a side view of vertical transistors formed in a vertical transistor region with a diode region masked in accordance with one or more embodiments;

FIG. 12 is a side view of vertical transistors masked in a vertical transistor region with a diode region un-masked in accordance with one or more embodiments;

FIG. 13 is a side view of a doped layer formed over an intrinsic layer of pillar structures in a diode region with a vertical transistor region masked in accordance with one or more embodiments;

FIG. 14 is a side view of interlayer dielectric deposited onto vertical transistor and diode regions and electrical contacts formed therein in accordance with one or more embodiments;

FIG. 15 is a side view of interlayer dielectric deposited onto an N-type vertical transistor region, a P-type vertical transistor region and a diode region and electrical contacts formed therein in accordance with one or more embodiments; and FIG. 16 is a side view of interlayer dielectric deposited onto an N-type vertical transistor region, a P-type vertical transistor region and a diode region with a merged doped layer and electrical contacts formed therein in accordance with one or more embodiments.

DETAILED DESCRIPTION

Figure 4:
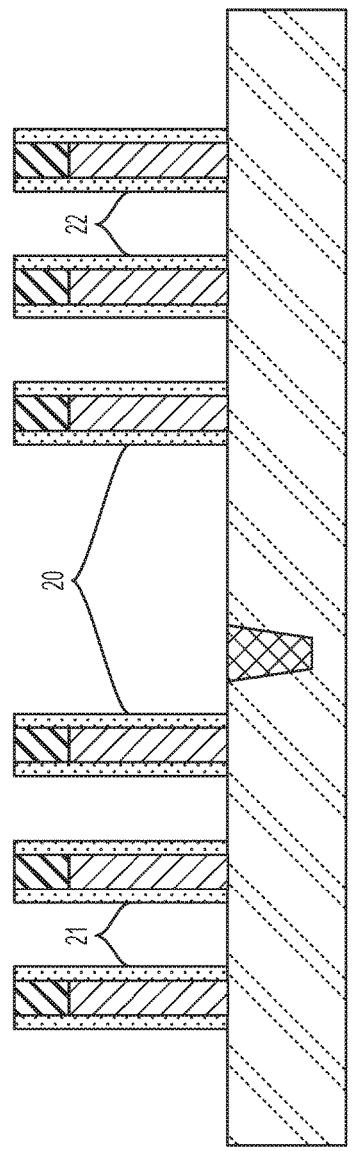

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique.

Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present invention, one or more embodiments relate to an integrated device that includes a substrate having a doped upper surface section and an insulator to define on opposite sides thereof first and second substrate regions. Vertical transistors are operably arranged on the doped upper surface section at the first substrate region, and P-I-N diodes are operably arranged on the doped upper surface section at the second substrate region.

With reference to FIG. 1, a semiconductor substrate 10 is provided. The semiconductor substrate 10 can be, for example, a bulk substrate including semiconductor material including, but not limited to, silicon (Si), silicon germanium (SiGe), strain-relaxed buffer (SRB) SiGe, silicon carbide (SiC), silicon-germanium-carbon (SiGeC) or other like semiconductor material. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. In addition, multiple layers of the semiconductor materials can be used as the semiconductor material of the semiconductor substrate 10.

The semiconductor substrate 10 is substantially planarized and has an upper surface 11. The semiconductor substrate 10 also has a shallow trench insulator (STI) 12 formed therein to define first and second semiconductor substrate regions 13 and 14 on opposites sides thereof as well as fin structures 15 and pillar structures 16. The first semiconductor substrate region 13 will be formed into a vertical transistor region and the second semiconductor region 14 will be formed into a diode region. Thus, as used herein, the phrases "first semiconductor substrate region 13" and "vertical transistor" region will hereinafter be used interchangeably and the phrases "second semiconductor substrate region 14" and "diode transistor" region will hereinafter be used interchangeably. The STI 12 has an upper surface that is substantially coplanar with the upper surface 11 of the semiconductor substrate and tapered sides and extends through a portion of the semiconductor substrate 10.

The fin structures 15 can be formed on the upper surface 11 in the first semiconductor substrate region 13 by sidewall imaging transfer processes or other similar processes. Each fin structure 15 has a lower section 151, which is formed of semiconductor material that can be similar to or different from the semiconductor material of the semiconductor substrate 10, an upper section 152 and sidewalls 153. The upper section 152 can be provided as a hard mask and can be formed of silicon nitride, titanium nitride or another similar material.

With reference to FIG. 2, the fin structures 15 can be arranged in one or more rows with each fin structure 15 in the row being elongate in a direction that is transverse to the row direction. In accordance with one or more embodiments, respective lengths of each of the fin structures 15 can exceed distances between adjacent fin structures 15 and the distances between the adjacent fin structures 15 can exceed the width of each of the fin structures 15.

The pillar structures 16 can be formed on the upper surface 11 in the second semiconductor substrate region 14 by sidewall imaging transfer processes or other similar processes. Each pillar structure 16 has a lower section 161, which is formed of semiconductor material that can be similar to or different from the semiconductor material of the semiconductor substrate 10, an upper section 162 and sidewalls 163. The upper section 162 can be provided as a hard mask and can be formed of silicon nitride, titanium nitride or another similar material.

With reference to FIG. 3, the pillar structures 16 can be arranged in a matrix with one or more rows and one or more columns. In accordance with one or more embodiments, respective distances between adjacent pillar structures 16 can exceed the respective lengths and widths of each of the pillar structures 16.

With reference to FIG. 4, sacrificial spacers 20 are formed on the fin structures 15 and the pillar structures 16. More particularly, first sacrificial spacers 21 are formed on the sidewalls 153 of each of the fin structures 15 in the first semiconductor substrate region 13 and second sacrificial spacers 22 are formed on the sidewalls 162 of each of pillar structures 16 in the second semiconductor substrate region 14. The first and second sacrificial spacers 21 and 22 can be formed of similar or different materials and can include nitride or oxide materials.

Figure 5:
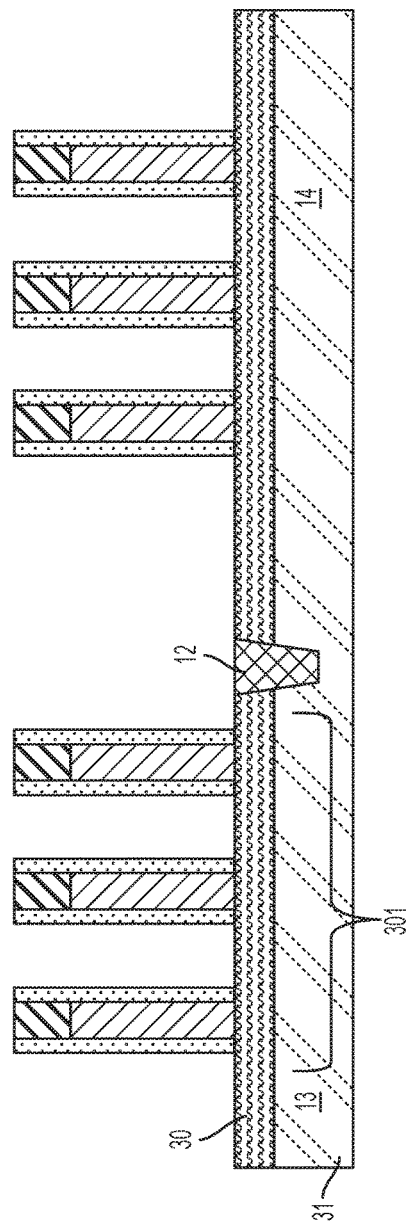

With reference to FIG. 5, the section of the semiconductor substrate 10 proximate to the upper surface 11 is doped by ion implantation, plasma doping, plasma immersion, etc. As shown in FIG. 5, the doping can result in the formation of a doped upper surface section 30 and an un-doped lower surface section 31 that underlies the doped upper surface section 30. The doped upper surface section 30 in the first semiconductor substrate region 13 can include a layer of a self-alinged N+ doped sub-region 301 of the doped upper surface section 30, which will be the basis of an nFET region, and a layer of a self-aligned P+ doped sub-region 302 (see FIGS. 15 and 16) of the doped upper surface section 30, which will be the basis of a pFET region and which is separated from adjacent sub-regions by an STI 12. The doped upper surface section 30 in the second semiconductor substrate region 14 can include a layer of either N+ or P+ doping. While the N+ and P+ doping are conducted in similar and interchangeable manners, for purposes of clarity and brevity, the following description until the description of FIGS. 15 and 16 will refer only to the formation and processing of the self-aligned N+ doped sub-region 301 and corresponding N+ doping in the second semiconductor region 14.

With reference to FIG. 6, a bottom spacer 40 and a dummy gate 41 are formed over the doped upper surface section 30 in the first semiconductor substrate region 13, over the STI 12 and in a proximal portion of the second semiconductor substrate region 14. Only the bottom spacer 40 is formed in the remainder of the second semiconductor substrate region 14. The bottom spacer 40 can include extended bottom spacer sections 42 that extend between respective bases of the first and second sacrificial spacers 21 and 22 of the outermost fin and pillar structures 15 and 16 and short bottom spacer sections 43 that extend between respective bases of the first sacrificial spacers 21 of adjacent fin structures 15 and between respective bases of the second sacrificial spacers 22 of the adjacent pillar structures 16. The bottom spacer 40 can be formed by way of directional nitride or oxide deposition. The dummy gate 41 is formed by a patterning process in the first semiconductor substrate region 13, over the STI 12 and in the proximal portion of the second semiconductor substrate region 14 to surround upper portions of the first sacrificial spacers 21 of the fin structures 15.

With reference to FIG. 7, a top spacer 50 is formed over the dummy gate 41 in the first semiconductor substrate region 13, over the dummy gate 41 over the STI 12 and over the bottom spacer 40 in the proximal portion of the second semiconductor substrate region 14. The top spacer 50 is also formed over the bottom spacer 40 in the remainder of the second semiconductor substrate region 14. The top spacer 50 is also formed along a sidewall of the dummy gate 41, over exposed portions of the first and second sacrificial spacers 21 and 22 and over exposed portions of the upper sections 152 of the fin structures 15 and the upper sections 162 of the pillar structures 16. The top spacer 50 can be formed by way of directional nitride or oxide uniform blanket deposition.

With reference to FIG. 8, a block mask 60 is formed over the top spacer 50 in the first semiconductor substrate region 13, over the top spacer 50 over the STI 12 and over the bottom and top spacers 40 and 50 in the proximal portion of the section semiconductor substrate region 14. While the block mask 60 thus covers an increased region of the second semiconductor substrate region 14 than the dummy gate 41, the block mask 60 is remote from a nearest one of the pillar structures 16 and the corresponding second sacrificial spacers 22 and the corresponding portion of the top spacer 50.

With reference to FIG. 9, respective portions of the top spacer 50 and the bottom spacer 40 that are exposed by the block mask 60 in the second semiconductor substrate region 14 are stripped along with the second sacrificial spacers 22 and the upper sections 162 of the pillar structures 16. This will result in the second semiconductor region 14 having only pillar structures 16 that only include lower sections 161, which are doped following the stripping. The doping can be similar to the doping of the doped upper surface section 30 such that, where the doped upper surface section 30 has N+ doping as shown in FIG. 9, the pillar structures 16 have N+ doping.

Figure 10:
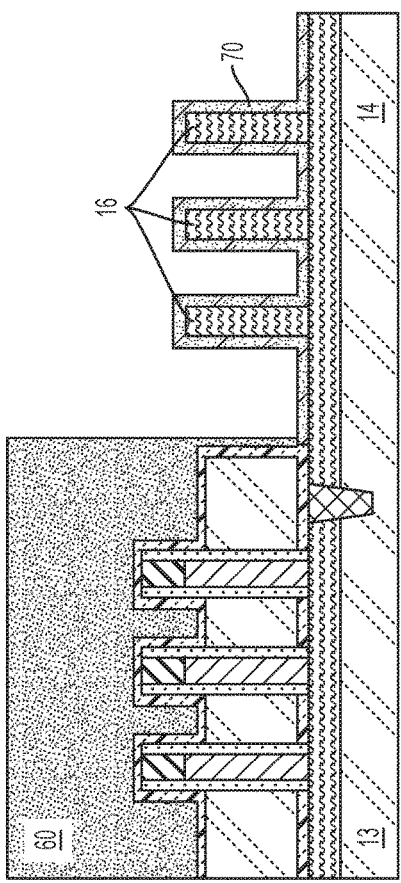

With reference to FIG. 10, an intrinsic semiconductor layer 70 is grown on the doped upper surface section 30 and the doped pillar structures 16 in the remainder of the second semiconductor substrate region 14 that is exposed by the block mask 60. The intrinsic semiconductor layer 70 thus has bottom portions running along the doped upper surface section 30, vertical portions running along sidewalls of the pillar structures 16 and upper portions running along uppermost surfaces of the pillar structures 16. The intrinsic semiconductor layer 70 can have varying thicknesses based on predefined applications of the pillar structures 16 whereby a relatively increased thickness of the intrinsic semiconductor layer 70 will provide for reduced rectification and relatively decreased thickness provides for a P-I-N diode that is suitable for attenuation, fast switching, photo-detection and high voltage applications.

Figure 11:
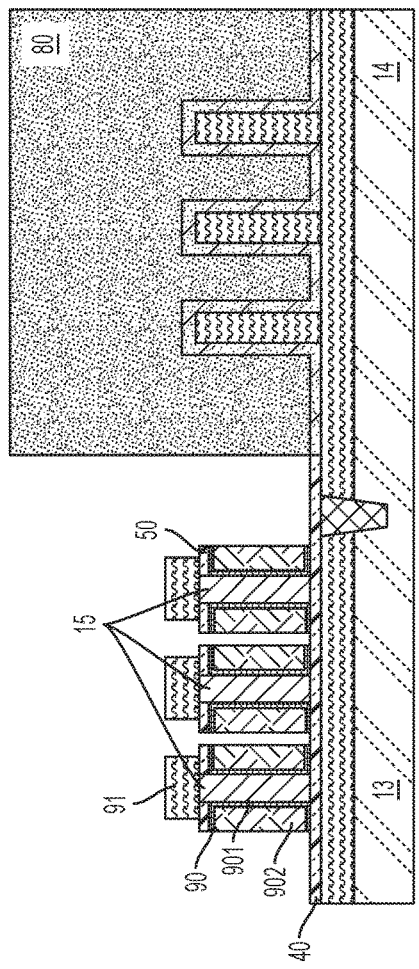

With reference to FIG. 11, a block mask 80 is formed over the intrinsic semiconductor layer 70 in the remainder of the second semiconductor region 14 and a similar mask is formed or maintained over the self-aligned P+ doped sub-region 302 of the doped upper surface section 30. Once the block mask 80 and the similar mask are formed, the material of the dummy gate 41 is removed and the material of the upper sections 152 of the fin structures 15 is removed. Then high-k metal gates 90 are formed to surround the fin structures 15 and N+ source and drain contacts 91 are grown in the self-aligned N+ doped sub-region 301 of the doped upper surface section 30. The high-k metal gates 90 include a high-k or gate dielectric layer 901, which includes a vertical portion that surrounds sidewalls of the fin structures 15 and upper and lower portions that extend away from the fin structures 15 along proximal portions of the bottom spacer 40 and the top spacer 50, and a metal gate electrode 902 disposed within the space delimited by the high-k dielectric 901.

The gate dielectric layer 901 includes a high k dielectric material, including, but not limited to, for example, silicon oxide, hafnium oxide, silicon nitride, aluminum oxide, germanium oxide, silicon oxynitride and others. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. In some cases, work function metal(s) are disposed over the gate dielectric layer 901. The type of work function metal(s) depends on the type of device and can include p-type work function metal materials and n-type work function metal materials. P-type work function materials include compositions such as ruthenium, palladium, platinum, cobalt, nickel and conductive metal oxides or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides or any combination thereof.

The metal gate electrode 902 includes gate conductive material that can be polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon or any suitable combination of these materials. The conductive material may further include dopants that are incorporated during or after deposition. The N+ source and drain contacts 91 are grown over the top spacer 50 and exposed upper surfaces of the resulting fin structures 15.

Figure 12:
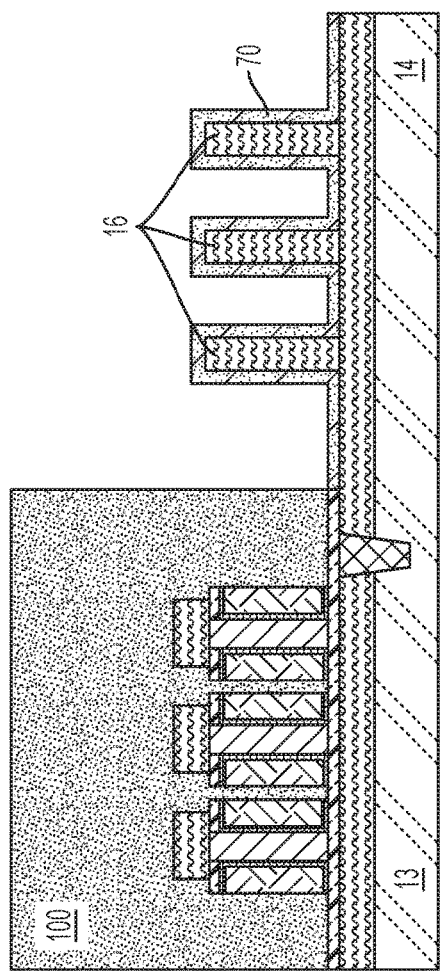

With reference to FIG. 12, once the high-k metal gates 90 are formed to surround the fin structures 15 and the N+ source and drain contacts 91 are grown in the self-aligned N+ doped sub-region 301 of the doped upper surface section 30, the block mask 80 and the mask over the self-aligned P+ doped sub-region 302 of the doped upper surface section 30 are removed and another similar block mask 100 is formed over the self-aligned N+ doped sub-region 301 of the doped upper surface section 30. At this point, high-k metal gates 90 can be formed to surround the corresponding fin structures 15 and P+ source and drain contacts 91 can be grown in the self-aligned P+ doped sub-region 302 of the doped upper surface section 30.

Figure 13:
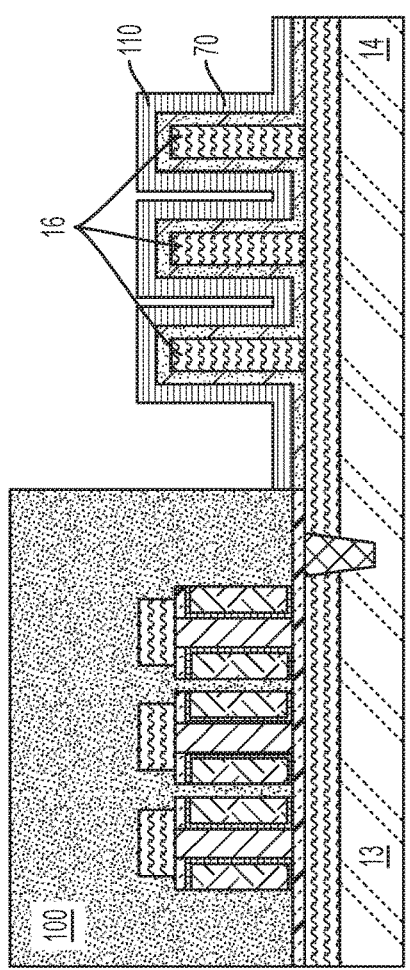

With reference to FIG. 13, a doped layer 110 is formed by way of epitaxial growth over the intrinsic semiconductor layer 70 in the remainder of the second semiconductor substrate region 14. The doped upper surface section 30 and the doped layer 110 can have complementary doping. That is, the doped layer 110 can have P+ doping in contrast to the N+ doping of the doped upper surface section 30 and the pillar structures 16 as described above. Conversely, the doped layer 110 can have N+ doping where the doped upper surface section 20 and the pillar structures 16 have P+ doping. In this way, a P+ doped layer 110 can be grown at a same time while top source/drain P+ doped layers are grown in a pFET region (given the bottom doped layer in P-I-N region is N+, which is formed while the bottom N+ doped layer is formed in nFET region) or an N+ doped layer 110 can be grown at a same time while top source/drain N+ doped layers are grown in an nFET region (given the bottom doped layer in P-I-N region is P+, which is formed while the bottom P+ doped layer is formed in pFET region).

Figure 14:
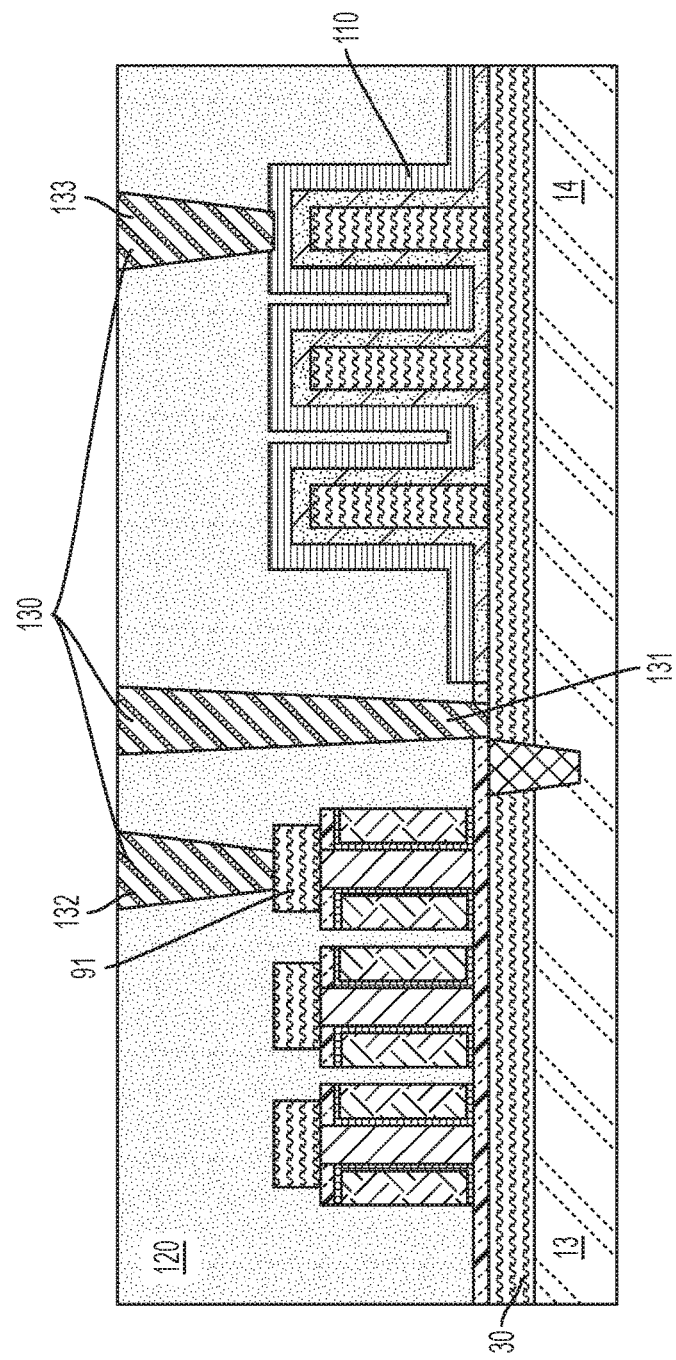

With reference to FIG. 14, the block mask 100 is removed and subsequently interlayer dielectric (ILD) 120 is deposited over an entirety of the device and processed (e.g., by chemical mechanical polishing (CMP) or other similar processes). Once the ILD 120 is deposited and processed, metal contacts 130 can be patterned. The metal contacts 130 can include at least one or more first conductors 131 that extend through the ILD 120 to the doped upper surface section 30, at least one or more second conductors 132 that extend through the ILD 120 to the source N+ or P+ source and drain contacts 91 in the first semiconductor substrate region 13 and at least one or more third conductors 133 that extend through the ILD 120 to the doped layer 110 in the second semiconductor substrate region 14.

Figure 15:
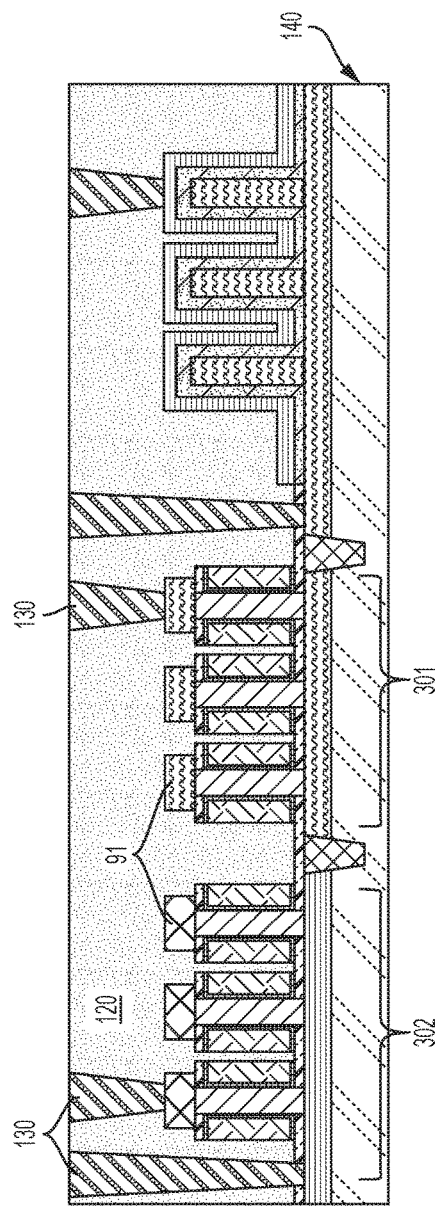

With reference to FIG. 15, a device 140 is illustrated with an N+ vertical transistor region in a first sub-region of the first semiconductor substrate region 13, a P+ vertical transistor region in a second sub-region of the first semiconductor substrate region 14, a diode region in a second semiconductor substrate region 14, N+ and P+ top source and drain contacts 91 and metal contacts 130.

Figure 16:
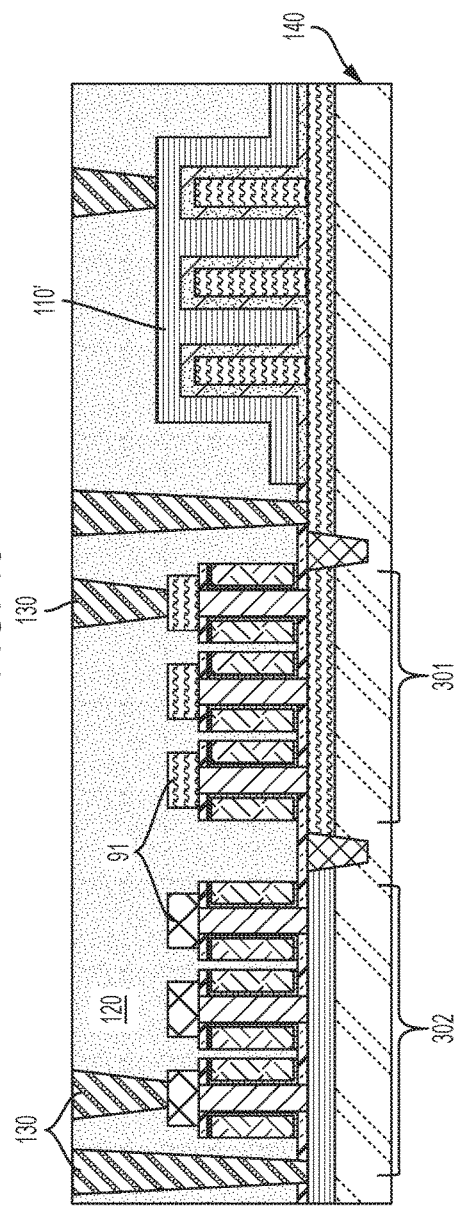

With reference to FIG. 16 and, in accordance with one or more further embodiments, the doped layer 110 of the second semiconductor substrate region 14 can be merged as a single doped layer 110'. That is, while the doped layer 110 can be formed into discrete pillar elements as shown in FIGS. 13-15, the single doped layer 110' has a unitary structure in which the space defined between adjacent pillar structures 16 is taken up by intervening doped layer material.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated device, comprising:
a substrate having a doped upper surface section and an insulator to define first and second substrate regions on opposite sides thereof;
vertical transistors operably arranged on the doped upper surface section at the first substrate region; and
P-I-N diodes operably arranged on the doped upper surface section at the second substrate region, wherein:
the doped upper surface section comprises N+ doping at a first sub-region of the first substrate region and P+ doping at a second sub-region of the first substrate region,
a first sub-group of the vertical transistors associated with the first sub-region comprises N+ source and drain contacts, and
a second sub-group of the vertical transistors associated with the second sub-region comprises P+ source and drain contacts.

2. The integrated device according to claim 1, wherein:
the vertical transistors comprise vertical field effect transistors (VFETs),
the substrate comprises an un-doped semiconductor substrate layer underlying the doped upper surface section, and
the insulator comprises a shallow trench insulator extending to the un-doped semiconductor substrate layer through the doped upper surface section.

3. The integrated device according to claim 1, further comprising:
an intrinsic layer disposed on the doped upper surface section at the second substrate region; and
a doped layer disposed over each one of the P-I-N diodes at the second substrate region.

4. The integrated device according to claim 3, wherein the doped upper surface section and the doped layer respectively comprise complementary doping.

5. The integrated device according to claim 3, wherein the doped layer is merged between adjacent ones of the P-I-N diodes.

6. The integrated device according to claim 1, further comprising:
interlayer dielectric (ILD) disposed around and over the vertical transistors and the P-I-N diodes;
at least one first conductor extending through the ILD to the doped upper surface section;
at least one second conductor extending through the ILD to at least a corresponding one of the vertical transistors; and
at least one third conductor extending through the ILD to at least a corresponding one of the P-I-N diodes.

7. A method of forming an integrated device, comprising:
doping an upper surface section of a substrate;
forming an insulator in the substrate to define first and second substrate regions on opposite sides thereof;
operably arranging vertical transistors for disposition on the doped upper surface section at the first substrate region; and
operably arranging P-I-N diodes for disposition on the doped upper surface section at the second substrate region,
wherein the doping of the upper surface section comprises N+ doping at a first sub-region of the first substrate region and P+ doping at a second sub-region of the first substrate region, and
wherein the operably arranging of the vertical transistors comprises forming N+ source and drain contacts for a first sub-group of the vertical transistors associated with the first sub-region and forming P+ source and drain contacts for a second sub-group of the vertical transistors associated with the second sub-region.

8. The method according to claim 7, wherein:
the vertical transistors comprise vertical field effect transistors (VFETs),
the substrate comprises an un-doped layer underlying the doped upper surface section, and
the insulator comprises a shallow trench insulator extending to the un-doped layer through the doped upper surface section.

9. The method according to claim 7, further comprising:
disposing an intrinsic layer on the doped upper surface section at the second substrate region; and
disposing a doped layer over each one of the plurality of P-I-N diodes at the second substrate region.

10. The method according to claim 9, wherein the doped upper surface section and the doped layer respectively comprise complementary doping.

11. The method according to claim 9, further comprising merging the doped layer between adjacent ones of the plurality of P-I-N diodes.

12. The method according to claim 7, further comprising:
disposing interlayer dielectric (ILD) around and over the vertical transistors and the P-I-N diodes;
forming at least one first conductor to extend through the ILD to the doped upper surface section;
forming at least one second conductor to extend through the ILD to at least a corresponding one of the vertical transistors; and
forming at least one third conductor to extend through the ILD to at least a corresponding one of the P-I-N diodes.

13. A method of forming an integrated device, comprising:
forming fin and pillar structures in vertical transistor and diode regions of a semiconductor substrate, respectively, which are insulated from each other;
doping an upper surface section of the semiconductor substrate;
sequentially modifying the fin structures to change the fin structures into vertical field effect transistors (VFETs) in the vertical transistor region and sequentially modifying the pillar structures to change the pillar structures into P-I-N diodes in the diode regions; and
patterning contacts for electrical coupling with the doped upper surface section, at least one of the VFETs and at least one of the P-I-N diodes,
wherein the vertical transistor region comprises N+ and P+ sub-regions and the sequential modifying comprises one of:
masking the diode and the P+ sub-region, forming high-k metal gates and N+ source and drain contacts in the N+ sub-region and forming high-k metal gates and P+ source and drain contacts in the P+ sub-region; and
masking the diode and the N+ sub-region, forming high-k metal gates and P+ source and drain contacts in the P+ sub-region and forming high-k metal gates and N+ source and drain contacts in the N+ sub-region.

14. The method according to claim 13, wherein the sequential modifying comprises completing the changing of the fin structures into the VFETs first or completing the changing of the pillar structures into the P-I-N diodes first.

15. The method according to claim 13, wherein the sequential modifying comprises:
   masking the vertical transistor region;
   stripping spacers and hardmasks in the diode region;
   doping the pillar structures in the diode region; and
   epitaxially growing intrinsic and doped layers in the diode region.

16. The method according to claim 15, further comprising merging the doped layer between adjacent ones of the P-I-N diodes.

* * * * *